United States Patent [19]

Schneider et al.

[11] Patent Number: 5,857,353
[45] Date of Patent: Jan. 12, 1999

[54] WALL COOLING APPARATUS FOR A CONTROL PANEL, WITH A FAN AND A LAMELLAR HEAT EXCHANGER

[75] Inventors: Stefan Schneider, Bad Endbach; Adam Pawlowski, Eschenburg-Wissenbach, both of Germany

[73] Assignee: Rittal-Werk Rudolf Loh GmbH & Co. KG, Herborn, Germany

[21] Appl. No.: 819,705

[22] Filed: Mar. 12, 1997

[30] Foreign Application Priority Data

Mar. 13, 1996 [DE] Germany ............... 196 09 687.1

[51] Int. Cl.⁶ .................................... F25D 17/04
[52] U.S. Cl. ........................... 62/404; 62/285; 62/263
[58] Field of Search ................. 62/272, 285, 404, 62/407, 408, 262, 263, 428; 165/71, 122, 104.34

[56] References Cited

U.S. PATENT DOCUMENTS 3,722,580 3/1973 Braver ............................ 62/263
4,747,275 5/1988 Amr et al. ........................ 62/426

FOREIGN PATENT DOCUMENTS 2060866 5/1981 United Kingdom ............... 62/263

Primary Examiner—John M. Sollecito
Attorney, Agent, or Firm—Jansson, Shupe, Bridge & Munger, Ltd.

[57] ABSTRACT

The invention relates to a wall air conditioning apparatus for a control panel, with a fan and a lamellar heat exchanger, featuring a box-like housing with an upper inlet opening and a lower outlet opening in the wall that faces the control panel, whereby the fan is arranged behind the inlet opening and the lamellar heat exchanger is arranged under the fan and over the outlet opening at an acute angle to this wall. For improved ventilation and drainage of condensation water, it is provided that the lamellae of the lamellar heat exchanger are at an acute angle to the floor of the housing and drop off toward the wall that faces away from the control cabinet, and that the floor of the housing is provided with a drain for condensate.

6 Claims, 1 Drawing Sheet

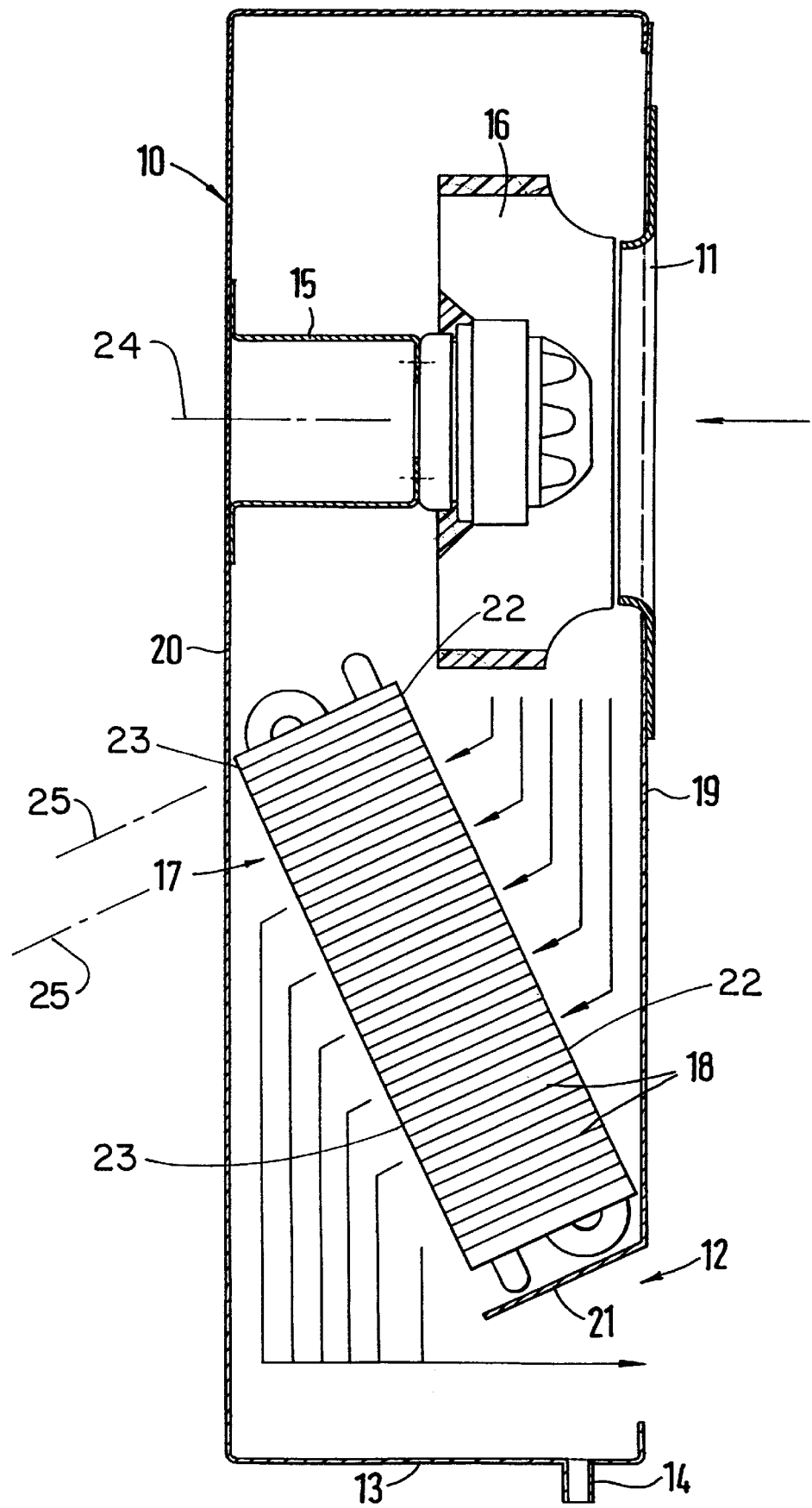

WALL COOLING APPARATUS FOR A CONTROL PANEL, WITH A FAN AND A LAMELLAR HEAT EXCHANGER

RELATED APPLICATION

This application claims priority from German patent application no. 196 09 687.1-42 filed on Mar. 13, 1996.

FIELD OF THE INVENTION

The invention relates to a wall cooling device for a control panel and more particularly to a cooling device involving a fan and a heat exchanger.

BACKGROUND OF THE INVENTION

These types of wall cooling devices replace a control panel wall element or can be designed as an accessory to the wall unit or built into the wall unit for a control panel, and serve to air condition the control panel. The warm air is thereby suctioned from the control panel by means of the fan and the inlet opening and is led over the lamellar heat exchanger and cooled, and fed back to the control panel via the outlet opening.

Such wall cooling devices, as illustrated in DE 92 00 134 U1, feature the lamellar heat exchanger positioned obliquely in the housing, in order to form an air channel with smaller structural height.

To ensure that the precipitated condensation water is not conducted back into the control panel in such a wall cooling unit, but is instead collected in a simple and reliable manner and led off to the outside, it is thereby provided that the lower edges of the vertically aligned lamellae extend at an acute angle with respect to the horizontal (that is, dropping off toward the wall that faces away from the control panel), that a collection groove is provided under the lowest points of the lower edges for the dripping condensation water and the collection groove is arranged at a right angle to the lamellae.

Collecting the condensed water in a reliable manner with this type of design takes place at the expense of optimal air circulation through the lamellar heat exchanger. Moreover, there is no assurance that all of the condensation water that can collect on the lower edges of the lamellae will reach the collection groove, since the air flow can dislodge drops of condensation water from the lower edges of the lamellae before they reach the lowest point of the lamellae.

The task of this invention is to design a wall air conditioning device of the type indicated above such that air flow is improved over the lamellar heat exchanger without concern that condensed water will be led back into the control panel.

According to the invention this task is accomplished by arranging the lamellae of the lamellar heat exchanger at an acute angle to the floor of the housing, dropping off toward the wall that faces away from the control panel, and that the floor of the housing is provided with a drain for the condensate.

With this type of orientation of the lamellae of the heat exchanger the air flow from the fan is forced in the direction toward the wall that faces away from the control panel. Any drops of condensation water that are swept along drip onto this wall and are collected at the floor of the housing before they can reach the outlet opening in the control panel. In this manner both problems associated with the wall air conditioner can be optimally solved—i.e., good ventilation over the lamellar heat exchanger and the prevention of entry of condensation water into the control panel.

In order to optimally utilize the suctioning effect of the fan a design is provided that connects the fan directly to the inlet opening, fastened to the wall that faces away from the control panel by means of a spacer block.

In order to prevent the formation of secondary air flow next to the lamellar heat exchanger, which can impair the cooling effect, it is provided that the lowest lamella of the lamellar heat exchanger connects to the upper edge of the outlet opening, and that the lower edge of the outlet opening is arranged at some distance from the floor of the housing, and that the uppermost lamella of the lamellar heat exchanger abuts the wall of the housing that faces away from the control panel.

If it is additionally provided that the uppermost lamella of the lamellar heat exchanger connects to the lower rear edge of the fan with a slight space in between, assuring that the outlet air flow of the fan is essentially led entirely over the lamellar heat exchanger.

OBJECTS OF THE INVENTION

It is an object of this invention to provide a wall cooling device that overcomes some of the problems and shortcomings of the prior art.

Another object of this invention is to provide a wall cooling device that does not allow condensation water to be conducted back into a control panel.

Still another object of the invention is to provide a wall cooling device that allows for adequate ventilation over the heat exchanger.

These and other important objects will be apparent from the following descriptions and from the drawings, wherein:

SUMMARY OF THE INVENTION

The invention involves a cooling device for a control panel comprised of a box-like housing having a first side wall facing toward the control panel, a second side wall facing away from the control panel and an upper and lower panel opposite each other and perpendicular to the first and second side walls. Upper and lower inlet openings are located in the side wall facing the control panel and a fan is connected to the side wall facing away from the control panel in registry with the upper inlet opening. A condensation drain is located in the lower panel and a heat exchanger having a plurality of lamella is positioned at an acute angle under the fan and above the lower outlet opening whereby the lamellae of the heat exchanger are at an acute angle to the lower panel of the housing and drop off toward the second side wall. Each of the lamellae defines a plane and has a horizontal front edge facing the control panel and a horizontal rear edge facing away from the control panel. The lamellae are positioned to extend laterallly between the side walls. Such positioning allows moisture that condenses on the lamella to gravity-drain away from the front edge and toward the rear edge of the lamella in the direction of the air flow across the heat exchanger.

In a preferred embodiment of the invention, the fan is connected directly to the inlet opening and is fastened to the second wall by the use of a spacer block.

In yet another preferred embodiment, the lower outlet opening has an upper and lower edge, the lower outlet opening is positioned in the first side wall such that its lower edge is above the lower panel of the housing, and the lowest lamella of the heat exchanger connects to the upper edge of the lower outlet opening. In such embodiment, the upper most lamella of the heat exchanger abuts the first side wall of the housing.

In still another preferred embodiment, the fan has a front and rear edge and the upper most lamella of the heat exchanger is positioned just below the rear edge of the fan.

In a highly preferred embodiment, a portion of the first side wall connected to the upper edge of the lower outlet opening is curved into the housing so as to form a drip plate that extends over the heat exchanger.

BRIEF DESCRIPTION OF THE DRAWINGS

FIG. 1 is a sectional view of the housing of a cooling device showing the lamellar heat exchanger positioned just below the fan and at an acute angle to the lower panel.

FIG. 2 is a perspective view of a wall air conditioner apparatus showing its relationship to the mounting wall or framework of a control panel (parts are broken away).

DETAILED DESCRIPTIONS OF THE PREFERRED EMBODIMENTS

FIG. 1 shows the invention which involves a wall air conditioner apparatus 26 that is fastened to a framework 28 or an open side of the panel body similar to a wall element, as shown in FIG. 2. The box-like housing 10 receives a fan 16 and a lamellar heat exchanger 17. An inlet opening 11 is provided in the upper area of the first side wall 19 that faces the control panel, into which a screen or the like is inserted. The fan 16 is arranged directly behind that. In a specific embodiment, the fan has a circular aperture and the inlet opening 11 includes an air guide portion extending into the housing 10.

The fan 16 is connected and supported by a fastening block 15 attached to the second side wall 20 that faces away from the control panel. The lamellar heat exchanger 17 rests under the fan 16 and is designed such that its lamellae 18 are at an acute angle to the floor or lower panel 13 of the housing 10 and slant downwardly and outwardly toward the wall 20 that faces away from the control panel. Each of the lamellae 18 defines a plane 25 and has a horizontal front edge 22 facing the control panel and a horizontal rear edge 23 facing away from the control panel. Such lamellae 18 are positioned to extend laterally (i.e., into and out of the drawing sheet) between those end walls which are orthogonal to the side walls 19, 20. Such positioning allows moisture that condenses on the lamella 18 to gravity-drain away from the front edge 22 and toward the rear edge 23 of the lamella 18 in the direction of the air flow across the heat exchanger 17. The panel 13 of the housing 10 is provided with a condensation drain 14 to drain condensed water out of the housing 10.

The lowest horizontal edge 23 of the uppermost of the lamella 18 abuts the wall 20, thereby substantially occluding any "bypass" air path that would otherwise be formed between such lamella and the wall 20. And the upper horizontal edge 22 of the uppermost of the lamella 18 is closely proximate the rear lower edge of the fan 16. When the apparatus is so configured, substantially all of the air drawn by the fan 16 through the inlet opening 11 moves parallel to the fan's axis of rotation 24 where it is forced to flow across the lamella 18, thereby urging condensate formed on such lamella 18 toward the lower horizontal edges of such lamella 18. Therefore, the condensate drips from such lower horizontal edges to the lower panel 13 and thence to the drain 14.

In a highly preferred embodiment, the uppermost horizontal edge of the lowest of the lamella 18 is closely adjacent to the upper edge of the outlet opening 12. This configuration provides the same result as described above, i.e., substantially no air can bypass the heat exchanger 17 since there is substantially no gap between the uppermost horizontal edge of the lowest of the lamella 18 and the upper edge of the outlet opening 12 flow which does not pass the lamellar heat exchanger 17 can develop here. Optimal cooling is thus achieved.

If drops of condensed water form on the lamellae 18, then the air flow that is led through the lamellar heat exchanger 17 sweep them along, so that these can then drip off onto wall 20 when meeting it or, perhaps more likely, drip from the lamellae 18 directly to the lower panel 13 and thence flow to the drain 14.

The lower edge of the outlet opening 12 is spaced at some distance from the panel 13 of the housing 10, so that a collection trough is formed under the entire wall air conditioner. The dripping, condensed water is collected in such trough and because the lower edge of the opening 12 is above the panel 13, it is assured that the condensation water remains in the collection trough and is not led back into the control panel, notwithstanding the flow of air through the opening.

The upper edge of the outlet opening 12 preferably has a drip plate extending generally toward the wall 20 and away from the wall 19. Most preferably, such plate 21 is in overlapping relationship to the lamellar heat exchanger 17. The drip plate 21 thereby drops down to the floor 13 of the housing 10, sot that condensed water that is present on the lower edge of the lamellar heat exchanger 17 is led in the direction of the wall 20 facing away from the control panel and is thus kept away from the outlet opening 12.

While the principles of this invention have been described in connection with specific embodiments, it should be understood clearly that these descriptions are made only by way of example and are not intended to limit the scope of the invention.

What is claimed:

1. A cooling apparatus for a control panel comprised of:
   a housing having a first side wall facing toward the control panel, a second side wall facing away from the control panel and upper and lower panels spaced from one another and extending between the first and second side walls;
   an upper inlet opening and a lower outlet opening in the side wall facing the control panel;
   a fan supported by the side wall facing away from the control panel and in registry with the upper inlet opening;
   a condensation drain located in the lower panel; and
   a heat exchanger between the fan and the lower outlet opening and having a plurality of lamella, each having a horizontal front edge facing the control panel and a rear edge facing away from the control panel each lamellae of the plurality of lamella being in a plane positioned at an acute angle with respect to the lower panel and extending laterally between the side walls, thereby allowing moisture condensing on the lamella to gravity-drain away from the front edge and toward the rear edge of the lamella in the direction of the air flow across the heat exchanger.

2. The cooling apparatus of claim 1 wherein:
   the fan is spaced slightly from the inlet opening; and
   the fan is supported on the second wall by a stationary spacer block between the fan and the second wall.

3. The cooling apparatus of claim 1 wherein:

the lower outlet opening has an upper and lower edge;

the lower edge is above the lower panel; and the heat exchanger is closely proximate the upper edge, thereby preventing significant air flow between the heat exchanger and the upper edge.

4. The cooling apparatus of claim 1 wherein the uppermost lamella of the heat exchanger abuts the second side wall of the housing.

5. The cooling apparatus of claim 1 wherein:

the fan has a rear edge spaced from the inlet opening; and the uppermost lamella of the heat exchanger is closely proximate the rear edge, thereby substantially preventing air from flowing between such uppermost lamella and the rear edge.

6. The cooling apparatus of claim 1 wherein:

the first side wall includes a drip plate extending toward the second side wall; and the drip plate is in overlapping relationship to the heat exchanger.

* * * * *